(12) United States Patent
Joo et al.

(10) Patent No.: US 9,627,096 B2
(45) Date of Patent: Apr. 18, 2017

(54) SEMICONDUCTOR MEMORY DEVICE (71) Applicant: SK hynix Inc., Gyeonggi-do (KR)

(72) Inventors: No-Guen Joo, Gyeonggi-do (KR); Do-Hong Kim, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/854,990

(22) Filed: Sep. 15, 2015

(65) Prior Publication Data
US 2016/0293243 A1 Oct. 6, 2016

(30) Foreign Application Priority Data
Apr. 6, 2015 (KR) .................. 10-2015-0048457

(51) Int. Cl.
*G11C 11/406* (2006.01)
*G11C 29/00* (2006.01)

(52) U.S. Cl.
CPC ...... *G11C 29/783* (2013.01); *G11C 11/40618* (2013.01); *G11C 11/406* (2013.01); *G11C 11/40615* (2013.01)

(58) Field of Classification Search
CPC .................................................. G11C 11/406
USPC ........................................................ 365/222
See application file for complete search history.

(56) References Cited

U.S. PATENT DOCUMENTS

| | | | | |
|---|---|---|---|---|
| 7,379,369 B2 * | 5/2008 | Lee | ....................... | G11C 11/406 365/222 |
| 7,379,370 B2 * | 5/2008 | Mori | ..................... | G11C 11/406 365/203 |
| 9,165,612 B2 * | 10/2015 | Lee | .......................... | G11C 7/02 |
| 9,275,716 B2 * | 3/2016 | Song | ........................ | G11C 7/02 |
| 2006/0209612 A1 * | 9/2006 | Kajigaya | ............... | G11C 11/406 365/222 |
| 2014/0297986 A1 * | 10/2014 | Lee | ....................... | G11C 11/401 711/167 |
| 2015/0043292 A1 * | 2/2015 | Lee | ....................... | G11C 29/025 365/201 |
| 2016/0042782 A1 * | 2/2016 | Narui | ................ | G11C 11/40611 365/222 |
| 2016/0196863 A1 * | 7/2016 | Shin | .................. | G11C 11/40611 365/222 |

FOREIGN PATENT DOCUMENTS

| | | |
|---|---|---|
| KR | 1020140029018 | 3/2014 |
| KR | 1020140070304 | 6/2014 |
| KR | 1020150002112 | 1/2015 |

* cited by examiner

*Primary Examiner* — Son Mai
(74) *Attorney, Agent, or Firm* — IP & T Group LLP (57) ABSTRACT

A semiconductor memory device may include a memory bank having a plurality of word lines arranged at a predetermined address interval, an address latching unit suitable for storing a target address corresponding to a target word line of the plurality of word lines, and a refresh control unit suitable for performing a refresh operation on first to Nth word lines having different address intervals from the target word line based on the target address in response to a smart refresh command, wherein N is a natural number.

23 Claims, 5 Drawing Sheets

SEMICONDUCTOR MEMORY DEVICE

CROSS-REFERENCE TO RELATED APPLICATIONS

The present application claims priority of Korean Patent Application No. 10-2015-0048457, filed on Apr. 6, 2015, which is incorporated herein by reference in its entirety.

BACKGROUND

1. Field

Exemplary embodiments of the present invention relate to a semiconductor design technology and, more particularly, to a semiconductor memory device for performing a refresh operation.

2. Description of the Related Art

A semiconductor memory device includes a plurality of memory banks for storing data. Each of the plurality of memory banks may include tens of millions of memory cells or more. Each of the memory cells includes a cell capacitor and a cell transistor. A semiconductor memory device stores data through an operation for charging or discharging electric charges in or from a cell capacitor. The amount of charges stored in the cell capacitor ideally needs to remain constant unless the cell capacitor performs any specific operations. However, the amount of charges stored in the cell capacitor may vary due to a voltage difference with peripheral circuits. Electric charges may be drained from a cell capacitor that has been charged or electric charges may be introduced into a cell capacitor that has been discharged. As described above, a change in the amount of charges of the cell capacitor means a change of data stored in the cell capacitor. This means that the stored data is lost, A semiconductor memory device performs a refresh operation to prevent such a loss of data.

As the process technology is advanced, the degree of integration of semiconductor memory devices is gradually increased. An increase in the degree of integration of semiconductor memory devices also influences the size of memory banks. A gradual reduction in the size of memory banks means a reduction of the interval between memory cells. This means that the interval between word lines respectively coupled to adjacent memory cells is reduced. As the interval between adjacent word lines is reduced, new issues are raised. For example, a coupling effect is generated between adjacent word lines. If such a coupling effect is generated between adjacent word lines, memory cells coupled to the adjacent word lines may not retain data stored therein. That is, a risk of losing data is increased.

To prevent such issues, a semiconductor memory device has only to perform a refresh operation on all the memory cells of memory banks. That is, the number of refresh operations may be increased to the extent that a loss of data can be prevented. However, if the number of refresh operations is increased, operation efficiency of a semiconductor memory device is deteriorated.

SUMMARY

Various embodiments are directed to a semiconductor memory device capable of controlling a refresh operation.

In an embodiment, a semiconductor memory device may include a memory bank having a plurality of word lines arranged at a predetermined address interval; an address latching unit suitable for storing a target address corresponding to a target word line of the plurality of word lines; and a refresh control unit suitable for performing a refresh operation on first to Nth word lines having different address intervals from the target word line based on the target address in response to a smart refresh command, wherein N is a natural number.

The semiconductor memory device may further include a word line driving unit suitable for driving the first to Nth word lines based on a control of the refresh control unit.

The refresh control unit may include first to Nth operation units suitable for generating first to Nth addresses by increasing or decreasing the target address by different intervals respectively; and an address selection unit suitable for selectively outputting the first to Nth addresses in response to the smart refresh command.

The refresh control unit may further include a counting unit suitable for generating first to Nth smart mode signals for controlling the address selection unit by counting the smart refresh command.

The address selection unit may output the first to Nth addresses in response to the first to Nth smart mode signals, respectively.

N may be a natural number of 2, and the first word lines have a first address interval from the target word line and the second word lines have a second address interval greater than the first address interval from the target word line.

The first and second operation units may generate the first and second addresses by increasing or decreasing the target address by the first and second address intervals, respectively.

In an embodiment, a semiconductor memory device may include a plurality of normal word lines arranged at a predetermined address interval; a plurality of redundancy word lines arranged at the predetermined interval and suitable for repairing the plurality of normal word lines; an address latching unit suitable for storing a target address corresponding to a target word line of the plurality of normal word lines; a refresh control unit suitable for performing a refresh operation on first and second word lines arranged at different first and second address intervals from the target word line based on the target address in first and second smart refresh modes; an address generation unit suitable for generating first and second addresses respectively, corresponding to the first and the second word lines in the first and the second smart refresh modes; a fuse unit suitable for storing information about a repair target address; and a word line driving unit suitable for comparing the information about the repair target address with the first and second addresses and driving the plurality of nor word lines or the plurality of redundancy word lines.

The refresh control unit may perform the refresh operation on the first word lines in the first smart refresh mode and performs the refresh operation on the second word lines with the target word line in the second smart refresh mode.

The address generation unit may output the first address in the first smart refresh mode and outputs the second address with the target address in the second smart refresh mode.

The fuse unit may group the repair target address and an address having a program interval from the repair target address and stores information about grouped addresses.

The program interval may comprise the first address interval.

The refresh control unit may include a first counting unit suitable for generating a smart refresh command in response to a refresh command; and a second counting unit suitable for generating first and second smart mode signals for controlling the first and the second smart refresh modes in response to the smart refresh command.

The address generation unit may include a first operation unit suitable for increasing or decreasing the target address by the first address interval and generating the first address in response to the first smart mode signal; and a second operation unit suitable for increasing or decreasing the target address by the second address interval and generating the second address in response to the second smart mode signal.

In an embodiment, a semiconductor memory device may include a plurality of normal word lines arranged at a predetermined address interval; a plurality of redundancy word lines arranged at the predetermined interval and suitable for repairing the plurality of normal word lines; an address latching unit suitable for storing a target address corresponding to a target word line of the plurality of normal word lines; and a control unit suitable for refreshing first and second word lines having first and second address intervals from the target word line, respectively, among the plurality of normal word lines based on the target address, wherein if the target address is a repair target address, the control unit refreshes third and fourth word lines having the first and second address intervals from a redundancy word line repairing the target word line, among the plurality redundancy word lines, instead of the first and second word lines.

The first address interval may be smaller than the second address interval, and the first and second word lines are first and second adjacent to the target word line, respectively.

The control unit may include The control unit may include a refresh control unit suitable for performing a refresh operation on the first and the second word lines in first and second smart refresh mode; an address generation unit suitable for generating first and second addresses respectively, corresponding to the first and the second word lines in the first and the second smart refresh modes; a fuse unit suitable for storing information about the repair target address; and a word line driving unit suitable for comparing the repair target address with the first and second addresses and driving the plurality of normal word lines or the plurality of redundancy word lines.

The control unit may refresh the first word lines in the first smart refresh mode and refreshes the second word lines with the target word line in the second smart refresh mode, wherein the control unit refreshes the third word lines in the first smart refresh mode and refreshes the fourth word lines with the redundancy word line in the second smart refresh mode, when the target address is the repair target address.

The address generation unit may output the first address in the first smart refresh mode and outputs the second address and the target address in the second smart refresh mode.

The fuse unit may group the repair target address and an address having a program interval from the repair target address and stores information about grouped addresses.

The program interval may comprise the first address interval.

The refresh control unit may include a first counting unit suitable for generating a smart refresh command in response to a refresh command; and a second counting unit suitable for generating first and second smart mode signals for controlling the first and the second smart refresh modes in response to the smart refresh command.

The address generation unit may include a first operation unit suitable for increasing or decreasing the target address by the first address interval and generating the first address in response to the first smart mode signal; and a second operation unit suitable for increasing or decreasing the target address by the second address interval and generating the second address in response to the second smart mode signal.

The second counting unit may enable the first smart mode signal while the smart refresh command pulses a predetermined number of times, and disables the first smart mode signal and enables the second smart mode signal after the smart refresh command pulses the predetermined number of times.

In an embodiment, an operation method of a semiconductor memory device may include grouping a repair target address and an address included within a program interval based on the repair target address and programming the group of addresses, generating a first smart address having a first address interval smaller than the program interval based on a target address in the first smart mode, generating a second smart address having a second address interval greater than the program interval based on the target address in the second smart mode, comparing the first smart address with the repair target address in the first smart mode, comparing the target address with the repair target address in the second smart mode, and refreshing a normal word line or redundancy word line corresponding to the first and the second smart addresses based on a result of the comparison.

In refreshing the normal word line or redundancy word line, if the first smart address is the repair target address, the redundancy word line corresponding to the first smart address may be refreshed.

In refreshing the normal word line or redundancy word line, if the first smart address is not the repair target address, the normal word line corresponding to the first smart address may be refreshed.

In refreshing the normal word line or redundancy word line, if the target address is the repair target address, the redundancy word line corresponding to the target address and the second smart address may be refreshed.

In refreshing the normal word line or redundancy word line, if the target address is not the repair target address, the normal word line corresponding to the target address and the second smart address may be refreshed.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
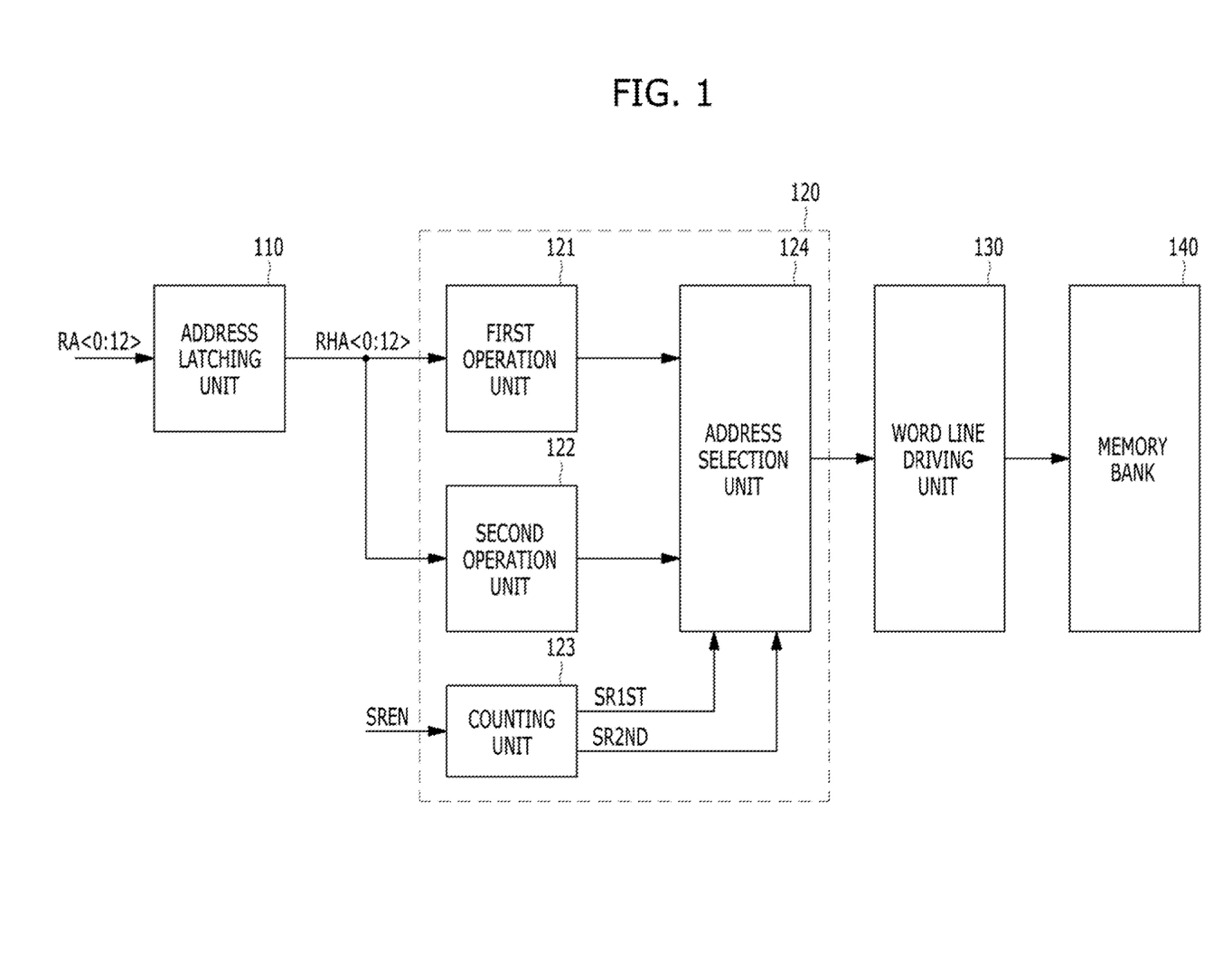
FIG. 1 is a configuration diagram illustrating a semiconductor memory device in accordance with an embodiment of the present invention.

FIG. 1 is a configuration diagram illustrating a semiconductor memory device in accordance with an embodiment of the present invention.

Referring to FIG. 1, the semiconductor memory device may include an address latching unit 110, a refresh control unit 120, a word line driving unit 130, and a memory bank 140.

The address latching unit 110 may store a target address RHA<0:12> of a target word line, among a plurality of row addresses RA<0:12> corresponding to a plurality of word lines. The target address RHA<0:12> may be an address corresponding to a word line that is, the target word line that is frequently accessed among the plurality of word lines.

The refresh control unit 120 may include a first operation unit 121, a second operation unit 122, a counting unit 123, and an address selection unit 124.

The first operation unit 121 may generate first addresses, corresponding to first word lines having a first address interval from the target word line, in response to the target address RHA<0:12>. The plurality of word lines may be sequentially disposed and arranged at a specific interval. The first address interval means the interval between adjacent word lines of the plurality of word lines. That is, the first word lines may be first adjacent to the target word line. For example, if the target word line is a word line corresponding to an Nth address, the first word lines may be word lines having $(N-1)^{th}$ and $(N+1)^{th}$ addresses.

The second operation unit 122 may generate second addresses, corresponding to second word lines having a second address interval from the target word line, in response to the target address RHA<0:12>. The second address interval may be greater than the first address interval. That is, the second word lines may be second or more adjacent to the target word line. For example, if the target word line is a word line corresponding to an $N^{th}$ address, the second word lines may be word lines having $(N-2)^{th}$ and $(N+2)^{th}$ addresses.

In an embodiment of the present invention, the first word lines have been illustrated as being first adjacent to the target word line, and the second word lines have been illustrated as being second or more adjacent to the target word line, but they may be set differently according to circumstances. For example, if the first address interval is set to be increased so that the first word lines are not first adjacent to the target word line, the second address interval may be set to be greater than the first address interval.

The counting unit 123 may generate a first smart mode signal SR1ST and a second smart mode signal SR2ND by counting smart refresh commands SREN. A predetermined number of the smart refresh commands SREN may be enabled to perform a smart refresh operation, in response to an external refresh command (not illustrated). The first smart mode signal SR1ST may be enabled while a first number of the smart refresh commands SREN are received. The second smart mode signal SR2ND may be enabled when the number of the smart refresh commands SREN is the first number or more. For example, if 32 smart refresh operations are performed in response to the smart refresh commands SREN, the first smart mode signal SR1ST may be enabled when first to thirty first smart refresh commands SREN are enabled so that a first smart mode operation is performed.

The second smart mode signal SR2ND may be enabled when a thirty second smart refresh command SREN is enabled so that a second smart mode operation is performed.

The address selection unit 124 may selectively output the first addresses that are outputted by the first operation unit 121 corresponding to the first word lines or the second addresses that are outputted by the second operation unit 122 corresponding to the second word lines in response to the first smart mode signal SR1ST or second smart mode signal SR2ND outputted by the counting unit 123.

The word line driving unit 130 may activate a word line corresponding to the address outputted by the address selection unit 124.

The memory bank 140 includes a plurality of memory cells for storing a plurality of data, and the plurality of memory cells may be coupled to the word lines. The plurality of word lines may be arranged at a predetermined address interval. In this case, the address interval refers to the interval between adjacent word lines when the plurality of word lines is arranged. Furthermore, the memory bank 140 may perform a refresh operation on a word line activated by the word line driving unit 130.

That is, when performing a smart refresh operation, the semiconductor memory device in accordance with an embodiment of the present invention may selectively perform a smart refresh operation depending on a first smart mode or a second smart mode. Furthermore, the semiconductor memory device may perform a smart refresh operation on first word lines that are most adjacent to a target word line that is frequently accessed and then perform a smart refresh operation on second word lines that are second adjacent to the target word line. Accordingly, the semiconductor memory device can improve efficiency of a smart refresh operation and guarantee reliability of data stored therein by preventing a loss of the data.

Figure 2:
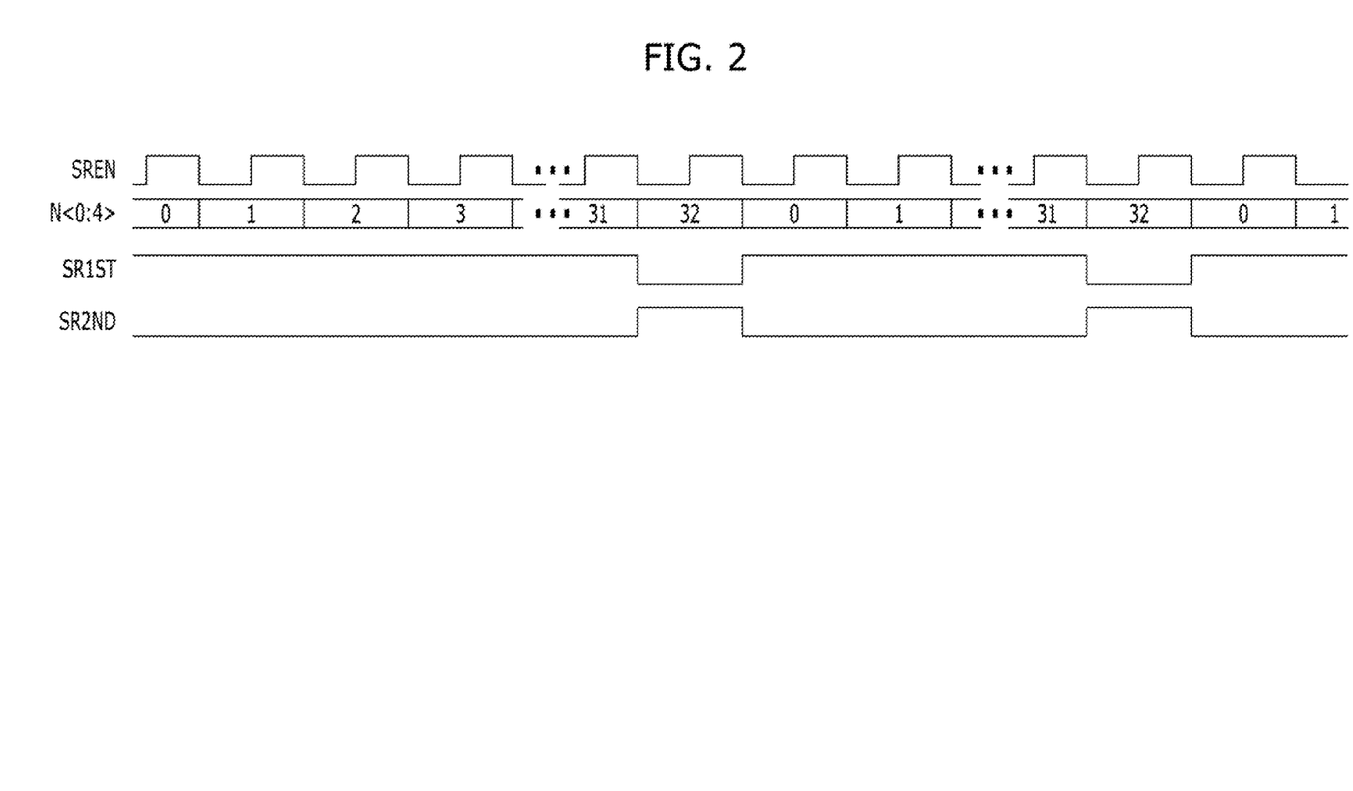
FIG. 2 is a timing diagram illustrating the operation of a counting unit of FIG. 1.

FIG. 2 is a timing diagram illustrating the operation of the counting unit 123 of FIG. 1.

Referring to FIGS. 1 and 2, the counting unit 123 may internally generate a counting signal N<0:4> by counting the smart refresh commands SREN. The first smart mode signal SR1ST or the second smart mode signal SR2ND may be enabled depending on the number of counted counting signals N<0:4>. The first smart mode signal SR1ST may be enabled while a predetermined number of smart refresh commands SREN is counted, and the second smart mode signal SR2ND may be enabled when the number of smart refresh commands SREN is a predetermined number or more.

Accordingly, the semiconductor memory device in accordance with an embodiment of the present invention may perform a smart refresh operation on second word lines that are second adjacent to a target word line that is frequently accessed after performing a predetermined number of smart refresh operations on first word lines that are most adjacent to the target word line.

Figure 3:
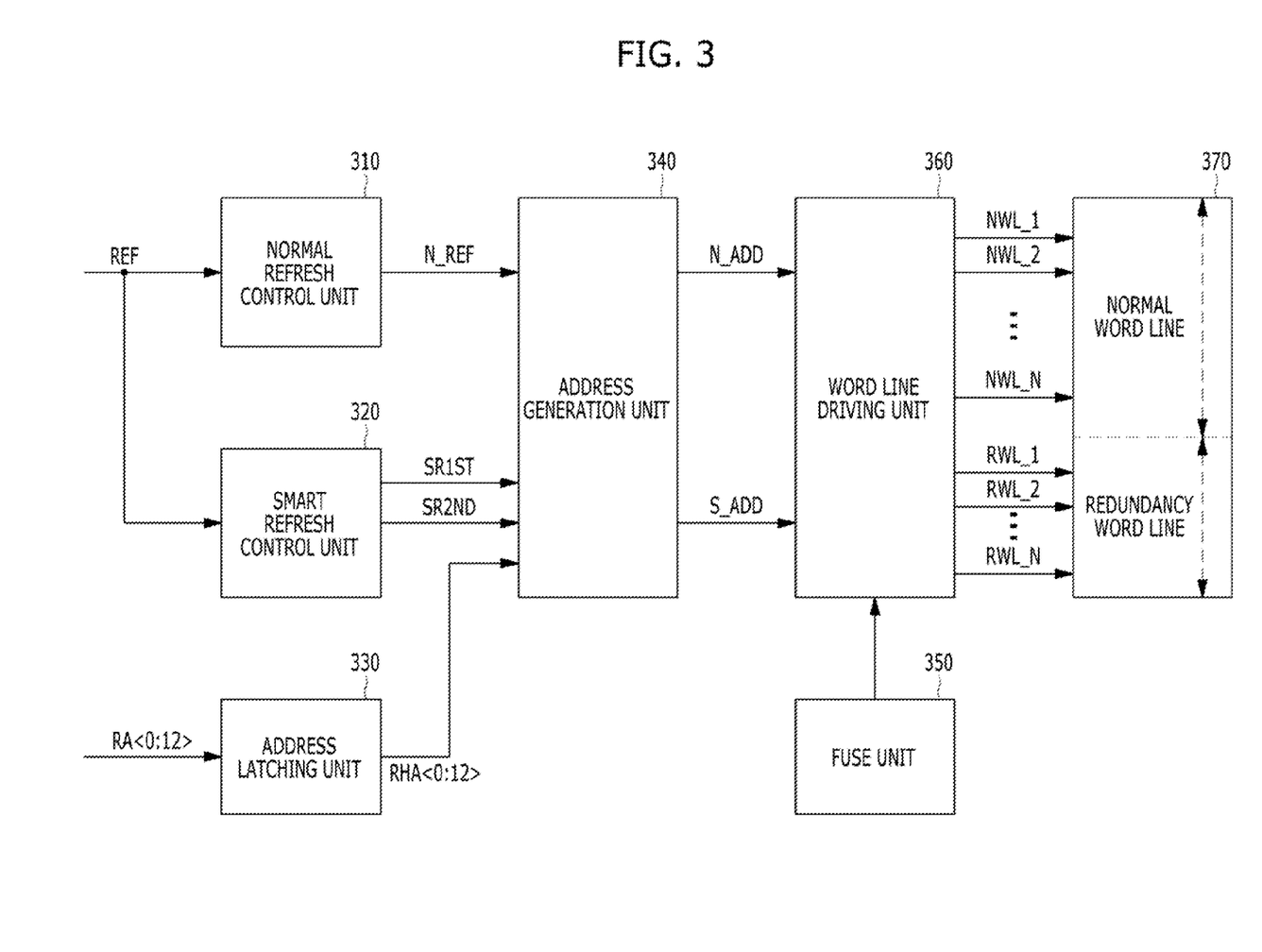
FIG. 3 is a configuration diagram illustrating a semiconductor memory device in accordance with an embodiment of the present invention.

FIG. 3 is a configuration diagram illustrating a semiconductor memory device in accordance with an embodiment of the present invention.

Referring to FIG. 3, the semiconductor memory device may include a normal refresh control unit 310, a smart refresh control unit 320, an address latching unit 330, an address generation unit 340, a fuse unit 350, a word line driving unit 360, and a memory bank 370.

The memory bank 370 includes a plurality of memory cells for storing a plurality of data. The plurality of memory cells may be coupled to a plurality of word lines. The plurality of word lines may include a plurality of normal word lines NWL_1 to NWL_N and a plurality of redundancy word lines RWL_1 to RWL_N for repairing the plurality of normal word lines NWL_1 to NWL_N. The plurality of word lines may be arranged at a predetermined address interval. Furthermore, the memory bank 370 may perform a refresh operation on a word line that is activated among the plurality of word lines.

The normal refresh control unit 310 may generate a normal refresh command N_REF in response to a refresh command REF. In this case, the refresh command REF may be a signal enabled when a refresh operation is performed.

The smart refresh control unit 320 may generate a first smart mode signal SR1ST and a second smart mode signal SR2ND enabled on a predetermined cycle by counting the refresh command REF. In this case, the first smart mode signal SR1ST may be a signal for performing a refresh operation on first word lines that are most adjacent to a target word line that is frequently accessed, among the plurality of word lines. The second smart mode signal SR2ND may be a signal for forming a refresh operation on second word lines that are second adjacent to the target word line. In this case, the smart refresh control unit 320 may include first and second counting units (not illustrated). The first counting unit may generate a smart refresh command (not illustrated) by counting the refresh command REF. The second counting unit may generate the first smart mode signal SR1ST and the second smart mode signal SR2ND by counting the smart refresh command.

The smart refresh control unit 320 may be the counting unit 123 of FIG. 1, and the smart refresh command (not illustrated) may be the smart refresh command SREN of FIG. 1.

The address latching unit 330 may store a target address RHA<0:12> of the target word line, among a plurality of row addresses RA<0:12> corresponding to the plurality of word lines.

The address generation unit 340 may generate a normal address N_ADD in response to the normal refresh command N_REF when a normal refresh operation is performed and may generate a smart address S_ADD corresponding to the first word lines or the second word lines in response to the first smart mode signal SR1ST or the second smart mode signal SR2ND when a smart refresh operation is performed. In this case, when the second smart mode signal SR2ND is enabled, the address generation unit 340 may generate the smart address S_ADD corresponding to the second word lines and the target word line.

The first word lines may be most adjacent to the target word line, and have a first address interval from the target word line. The second word lines may be second or more adjacent to the target word line, and have a second address interval from the target word line. For example, if an address corresponding to the target word line is an $N^{th}$ address, addresses corresponding to the first word lines may be $(N-1)^{th}$ and $(N+1)^{th}$ addresses. Addresses corresponding to the second word lines may be $(N-2)^{th}$ and $(N+2)^{th}$ addresses.

The fuse unit 350 may store address information corresponding to a target word line that is to be repaired among the plurality of normal word lines NWL_1 to NWL_N. In this case, the target word line to be repaired may be a normal word line corresponding to a defective memory cell of the plurality of memory cells. Furthermore, the fuse unit 350 may program a repair target address and an address having a program interval from the repair target address. In this case, the address having the program interval may mean an address that is most adjacent to the repair target address. Accordingly, the fuse unit 350 may store the address information by programming the repair target address and the most adjacent address together. For example, if a repair target address is a No. 1 address, a No. 2 address may also be programmed although it is not the repair target address. In this case, address information corresponding to No. 1 and No. 2 addresses may be stored in the fuse unit 350. That is, the target word line is not repaired one by one, but is grouped with an adjacent word line and repaired. The adjacent address may be any one of addresses corresponding to the first word lines most adjacent to the target word line.

Accordingly, when the first smart mode signal SR1ST is enabled, the address generation unit 340 may generate only the smart address S_ADD corresponding to the first word lines and output the generated smart address S_ADD. In contrast, when the second smart mode signal SR2ND is enabled, it is difficult to check whether the target word line is a normal word line or a redundancy word line depending on the second word lines since the second word lines are second or more adjacent to the target word line and do not correspond to an address in the program interval. Accordingly, when the second smart mode signal SR2ND is enabled, the address generation unit 340 may generate the smart address S_ADD corresponding to the target word line and the second word lines.

The word line driving unit 360 may activate the plurality of normal word lines NWL_1 to NWL_N or the plurality of redundancy word lines RWL_1 to RWL_N corresponding to the normal address N_ADD or the smart address S_ADD, in response to repair information outputted by the fuse unit 350.

An operation of the semiconductor memory device in accordance with an embodiment of the present invention is described below.

First, when performing a normal refresh operation, the semiconductor memory device may generate the normal address N_ADD in response to the normal refresh command N_REF, may activate the plurality of normal word lines NWL_1 to NWL_N in response to the generated normal address N_ADD, and may perform a refresh operations. A repair target word line that belongs to the plurality of normal word lines NWL_1 to NWL_N may be substituted with a corresponding redundancy word line of the plurality of redundancy word lines RWL_1 to RWL_N and activated.

When performing a smart refresh operation, the semiconductor memory device may generate the smart address S_ADD in response to the first smart mode signal SR1ST or the second smart mode SR2ND.

In a first smart mode, the address generation unit 340 may generate the smart address S_ADD corresponding to first word lines that have a first address interval from a target word line having the target address RHA<0:12>. Accordingly, the word line driving unit 360 may activate the first word lines. In this case, the word line driving unit 360 may determine whether the target address RHA<0:12> is a repair target address by checking the smart address S_ADD corresponding to the first word lines. If the target address RHA<0:12> is a normal address, the word line driving unit 360 may activate corresponding word lines of the plurality of normal word lines NWL_1 to NWL_N and perform a refresh operation on the corresponding word lines. If the target address RHA<0:12> is the repair target address, the word line driving unit 30 may activate corresponding word lines of the plurality of redundancy word lines RWL_1 to RWL_N.

In a second smart mode, the address generation unit 340 may generate the target address RHA<0:12> and the smart address S_ADD corresponding to second word lines that have a second address interval from a target word line having the target address RHA<0:12>. Accordingly, the word line driving unit 360 may activate the target word line and the second word lines. In this case, the word line driving unit 360 may determine whether the target address RHA<0:12> is a repair target address. First, if the target address RHA<0:12> is a normal address, the word line driving unit 360 may activate word lines that correspond to the target address RHA<0:12> and the smart address S_ADD among the plurality of normal word lines NWL_1 to NWL_N. If the target address RHA<0:12> is the repair target address, the word line driving unit 360 may map the target word line and the second word lines to corresponding word lines of the plurality of redundancy word lines RWL_1 to RWL_N and activate the corresponding word lines.

The smart refresh operation is described in detail with reference to FIGS. 4 to 7.

FIGS. 4 to 7 illustrate as an example that a target word line is the fifth normal word line NWL_5.

Figure 4:
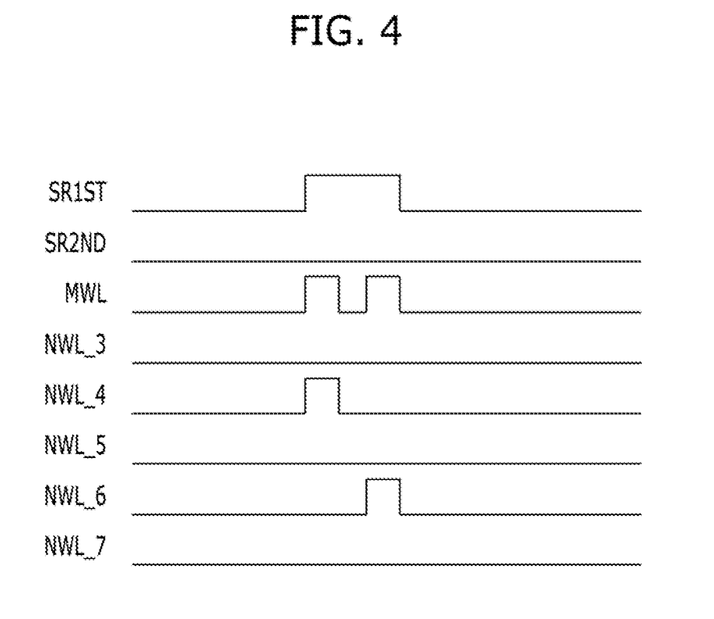
FIG. 4 is a timing diagram illustrating an operation when a target address is a normal address in a first smart mode.

FIG. 4 is a timing diagram illustrating an operation when a target address is a normal address in the first smart mode.

Referring to FIGS. 3 and 4, when the refresh command REF is counted by the smart refresh control unit 320 and thus the first smart mode signal SR1ST is enabled, a main word line driving signal MWL is enabled twice. Accordingly, first word lines having a first address interval from a target word line may be sequentially activated. Since the target word line is the fifth normal word line NWL_5, the fourth normal word line NWL_4 and the sixth normal word line NWL_6 may be sequentially activated, so a refresh operation may be performed. In this case, the main word line driving signal MWL may be a pulse signal for performing the refresh operation in response to the smart refresh command (not illustrated).

Figure 5:
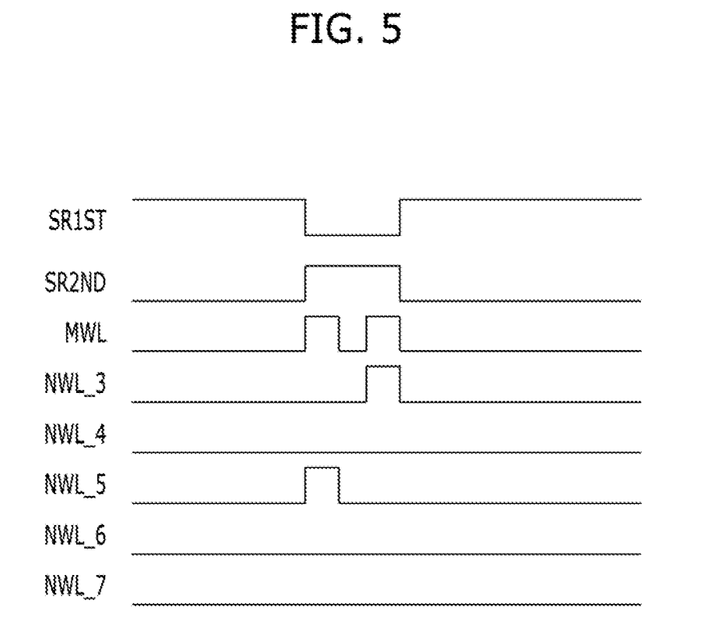
FIG. 5 is a timing diagram illustrating an operation when a target address is a normal address in a second smart mode.

FIG. 5 is a timing diagram illustrating an operation when a target address is a normal address in the second smart mode.

Referring to FIGS. 3 and 5, after the refresh command REF is counted a predetermined number of times, the second smart mode signal SR2ND is enabled, and the main word line driving signal MWL is enabled twice. Accordingly, a target word line NWL_5 and a third normal word line NWL_3 of second word lines NWL_3 and NWL_7 having a second address interval from the target word line NWL_5 may be sequentially activated. In this case, the third normal word line NWL_3 that has an interval of −2 from the target word line NWL_5 is activated. In some embodiments, the seventh word line NWL_7 having an interval of +2 from the target word line NWL_5 may be activated or both the second word lines NWL_3 and NWL_7 may be sequentially activated through internal control.

Figure 6:
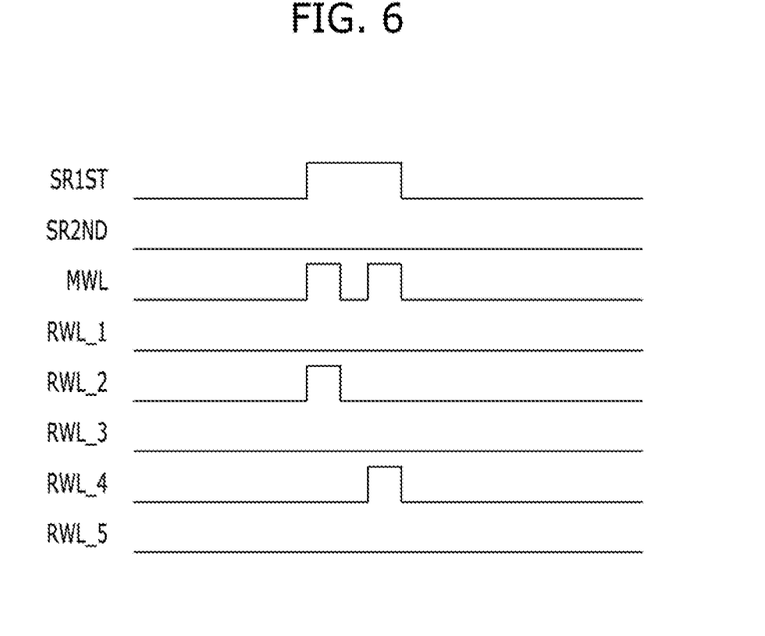
FIG. 6 is a timing diagram illustrating an operation when a target address is a redundancy address in the first smart mode.

FIG. 6 is a timing diagram illustrating an operation when a target address is a redundancy address in the first smart mode.

From FIGS. 3 and 6, it may be seen that the target word line NWL_5, that is, a repair target word line, is repaired by the third redundancy word line RWL_3. Accordingly, when the first smart mode signal SR1ST is enabled and thus the main word line driving signal MWL is sequentially enabled, first word lines are subject to address mapping to redundancy word lines. The second and the fourth redundancy word lines RWL_2 and RWL_4 having a first address interval from the third redundancy word line RWL_3 other than the fourth and the sixth normal word lines NWL_4 and NWL_6 may be sequentially activated, so a refresh operation may be performed.

Figure 7:
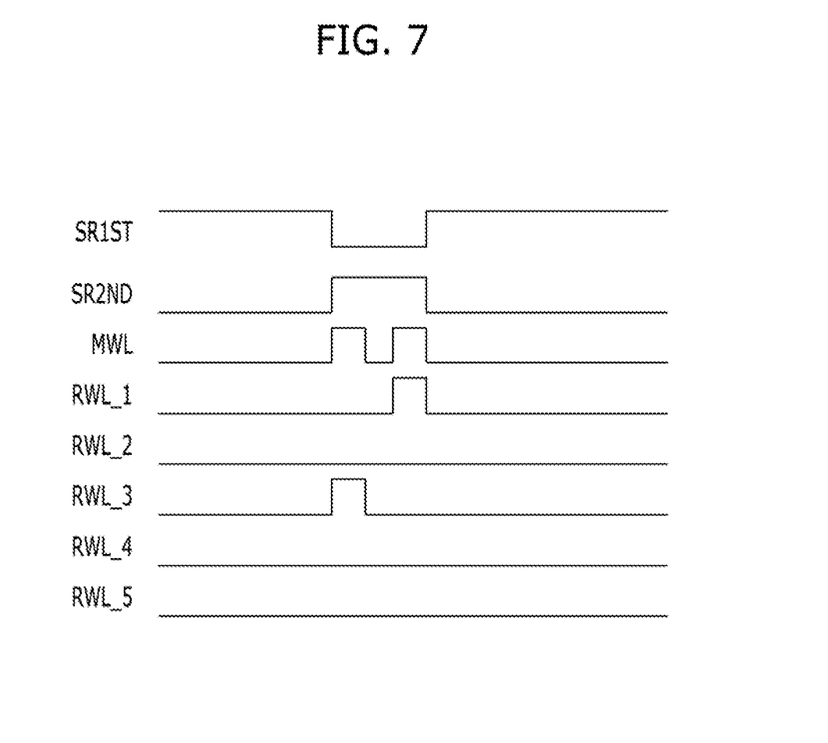
FIG. 7 is a timing diagram illustrating an operation when a target address is a redundancy address in the second smart mode.

FIG. 7 is a timing diagram illustrating an operation when a target address is a redundancy address in the second smart mode.

From FIGS. 3 and 7, it may be seen that the target word line NWL_5, that is, a repair target word line, is repaired by the third redundancy word line RWL_3. After the refresh command REF is counted a predetermined number of times, the second smart mode signal SR2ND is enabled, and the main word line driving signal MWL is enabled twice. Accordingly, the repaired third redundancy word line RWL_3 may be activated, and a redundancy word line RWL_1 of second word lines RWL_1 and RWL_5 may be activated. In this case, the second word lines RWL_1 and RWL_5 may have a second address interval from the third redundancy word line RWL_3 to which the third and the seventh nor word line NWL_3 or NWL_7 are subject to address mapping.

That is, the semiconductor memory device in accordance with an embodiment of the present invention can selectively perform a smart refresh operation depending on the first smart mode or the second smart mode. Furthermore, the semiconductor memory device can refresh a normal word line or a redundancy word line depending on whether a target address is a repair target address. The semiconductor memory device may perform a smart refresh operation on first word lines that are most adjacent to a target word line that is frequently accessed and then perform a smart refresh operation on second word lines that are second adjacent to the target word line. If the target word line is a repair target word line, the semiconductor memory device may activate a redundancy word line by mapping the first word lines and the second word lines to the redundancy word line and perform a refresh operation. Accordingly, the semiconductor memory device can improve efficiency of a smart refresh operation since it can properly perform the smart refresh operation on a redundancy word line although a target word line is a repair target word line. The semiconductor memory device can guarantee reliability of data stored therein by preventing a loss of the data.

The semiconductor memory device in accordance with an embodiment of the present invention may perform such an operation as follows.

The semiconductor memory device may perform an operation for grouping a repair target address and an address having a program interval from the repair target address and programming the group of addresses, generating a first smart address having a first address interval smaller than the program interval from a target address in the first smart mode, generating a second smart address having a second address interval greater than the program interval from the target address in the second smart mode, comparing the first smart address with the repair target address in the first smart mode, comparing the target address with the repair target address in the second smart mode, and refreshing a normal word line or a redundancy word line corresponding to the first and the second smart addresses based on a result of the comparison.

The semiconductor memory device in accordance with embodiments of the present invention can improve efficiency of a refresh operation and guarantee reliability of data stored therein by preventing a loss of the data.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device, comprising:
a memory bank having a plurality of word lines arranged at a predetermined address interval;
an address latching unit suitable for storing a target address corresponding to a target word line of the plurality of word lines; and
a refresh control unit suitable for performing a refresh operation on first and second word lines having a first address interval and a second address interval, respectively, from the target word line based on the target address in response to a smart refresh command,
wherein, when the target word line is an Nth word line, and the first word lines having the first address interval from the target word line include (N−1)th and (N+1)th word lines, and the second word lines having the second address interval from the target word line include (N−2)th and (N+2)th word lines, where N is a natural number.

2. The semiconductor memory device of claim 1, further comprising:
a word line driving unit suitable for driving the first and second word lines based on a control of the refresh control unit.

3. The semiconductor memory device of claim 1, wherein the refresh control unit comprises:
first and second operation units suitable for generating first and second addresses by increasing or decreasing the target address by the first and second address intervals, respectively; and
an address selection unit suitable for selectively outputting the first and second addresses in response to the smart refresh command.

4. The semiconductor memory device of claim 3, wherein the refresh control unit further comprises:
a counting unit suitable for generating first and second smart mode signals for controlling the address selection unit by counting the smart refresh command.

5. The semiconductor memory device of claim 4, wherein the address selection unit outputs the first and second addresses in response to the first and second smart mode signals, respectively.

6. The semiconductor memory device of claim 3, wherein the first and second operation units generate the first and second addresses by increasing or decreasing the target address by the first and second address intervals, respectively.

7. A semiconductor memory device, comprising:
a plurality of normal word lines arranged at a predetermined address interval;
a plurality of redundancy word lines arranged at the predetermined interval and suitable for repairing the plurality of normal word lines;
an address latching unit suitable for storing a target address corresponding to a target word line of the plurality of normal word lines;
a refresh control unit suitable for performing a refresh operation on first and second word lines arranged at different first and second address intervals from the target word line based on the target address in first and second smart refresh modes;
an address generation unit suitable for generating first and second addresses respectively, corresponding to the first and the second word lines in the first and the second smart refresh modes;
a fuse unit suitable for storing information about a repair target address; and
a word line driving unit suitable for comparing the information about the repair target address with the first and second addresses and driving the plurality of normal word lines or the plurality of redundancy word lines.

8. The semiconductor memory device of claim 7, wherein the refresh control unit performs the refresh operation on the first word lines in the first smart refresh mode and performs the refresh operation on the second word lines with the target word line in the second smart refresh mode.

9. The semiconductor memory device of claim 8, wherein the address generation unit outputs the first address in the first smart refresh mode and outputs the second address with the target address in the second smart refresh mode.

10. The semiconductor memory device of claim 7, wherein the fuse unit groups the repair target address and an address having a program interval from the repair target address and stores information about grouped addresses.

11. The semiconductor memory device of claim 10, wherein the program interval comprises the first address interval.

12. The semiconductor memory device of claim 7, wherein the refresh control unit comprises:
a first counting unit suitable for generating a smart refresh command in response to a refresh command; and
a second counting unit suitable for generating first and second smart mode signals for controlling the first and the second smart refresh modes in response to the smart refresh command.

13. The semiconductor memory device of claim 12, wherein the address generation unit comprises:
a first operation unit suitable for increasing or decreasing the target address by the first address interval and generating the first address in response to the first smart mode signal; and
a second operation unit suitable for increasing or decreasing the target address by the second address interval and generating the second address in response to the second smart mode signal.

14. A semiconductor memory device, comprising:
a plurality of normal word lines arranged at a predetermined address interval;
a plurality of redundancy word lines arranged at the predetermined interval and suitable for repairing the plurality of normal word lines;
an address latching unit suitable for storing a target address corresponding to a target word line of the plurality of normal word lines; and
a control unit suitable for refreshing first and second word lines having first and second address intervals from the target word line, respectively, among the plurality of normal word lines based on the target address,
wherein if the target address is a repair target address, the control unit refreshes third and fourth word lines having the first and second address intervals from a redundancy word line repairing the target word line, among the plurality redundancy word lines, instead of the first and second word lines.

15. The semiconductor memory device of claim 14, wherein the first address interval is smaller than the second address interval, and the first and second word lines are first and second adjacent to the target word line, respectively.

16. The semiconductor memory device of claim 14, wherein the control unit comprises:
a refresh control unit suitable for performing a refresh operation on the first and the second word lines in first and second smart refresh mode;

an address generation unit suitable for generating first and second addresses respectively, corresponding to the first and the second word lines in the first and the second smart refresh modes;

a fuse unit suitable for storing information about the repair target address; and a word line driving unit suitable for comparing the repair target address with the first and second addresses and driving the plurality of normal word lines or the plurality of redundancy word lines.

17. The semiconductor memory device of claim 16, wherein the control unit refreshes the first word lines in the first smart refresh mode and refreshes the second word lines with the target word line in the second smart refresh mode, wherein the control unit refreshes the third word lines in the first smart refresh mode and refreshes the fourth word lines with the redundancy word line in the second smart refresh mode, when the target address is the repair target address.

18. The semiconductor memory device of claim 17, wherein the address generation unit outputs the first address in the first smart refresh mode and outputs the second address and the target address in the second smart refresh mode.

19. The semiconductor memory device of claim 16, wherein the fuse unit groups the repair target address and an address having a program interval from the repair target address and stores information about grouped addresses.

20. The semiconductor memory device of claim 19, wherein the program interval comprises the first address interval.

21. The semiconductor memory device of claim 16, wherein the refresh control unit comprises:
    a first counting unit suitable for generating a smart refresh command in response to a refresh command; and
    a second counting unit suitable for generating first and second smart mode signals for controlling the first and the second smart refresh modes in response to the smart refresh command.

22. The semiconductor memory device of claim 21, wherein the address generation unit comprises:
    a first operation unit suitable for increasing or decreasing the target address by the first address interval and generating the first address in response to the first smart mode signal; and
    a second operation unit suitable for increasing or decreasing the target address by the second address interval and generating the second address in response to the second smart mode signal.

23. The semiconductor memory device of claim 21, wherein the second counting unit enables the first smart mode signal while the smart refresh command pulses a predetermined number of times, and disables the first smart mode signal and enables the second smart mode signal after the smart refresh command pulses the predetermined number of times.

* * * * *